(12) United States Patent
Wakabayashi et al.

(10) Patent No.: US 11,393,618 B2
(45) Date of Patent: Jul. 19, 2022

(54) MAGNETIC MATERIAL AND MAGNETIC ELEMENT

(71) Applicant: Nippon Telegraph and Telephone Corporation, Tokyo (JP)

(72) Inventors: Yuki Wakabayashi, Tokyo (JP);
Yoshiharu Krockenberger, Tokyo (JP);
Hideki Yamamoto, Tokyo (JP);
Yoshitaka Taniyasu, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 97 days.

(21) Appl. No.: 16/963,562

(22) PCT Filed: Feb. 15, 2019

(86) PCT No.: PCT/JP2019/005561
§ 371 (c)(1),
(2) Date: Jul. 21, 2020

(87) PCT Pub. No.: WO2019/160080
PCT Pub. Date: Aug. 22, 2019

(65) Prior Publication Data
US 2020/0357555 A1    Nov. 12, 2020

(30) Foreign Application Priority Data

Feb. 16, 2018  (JP) .............................. JP2018-025897

(51) Int. Cl.
*H01F 10/18* (2006.01)
*H01F 10/10* (2006.01)
(Continued)

(52) U.S. Cl.
CPC ............. *H01F 10/18* (2013.01); *H01F 1/407* (2013.01); *H01F 10/10* (2013.01); *H01L 43/10* (2013.01);
(Continued)

(58) Field of Classification Search
None
See application file for complete search history.

(56) References Cited

U.S. PATENT DOCUMENTS 5,189,010 A * 2/1993 Strom ................. H01L 39/2451
252/519.15
5,565,414 A * 10/1996 Akimitsu ............ H01L 39/2451
505/121
(Continued)

FOREIGN PATENT DOCUMENTS

WO    WO-2016156599 A1 * 10/2016    ......... C25B 11/0773

OTHER PUBLICATIONS

Chen et al., Inorg. Chem., 2020, 59, 4049-4057. (Year: 2020).*
(Continued)

*Primary Examiner* — Kevin M Bernatz
(74) *Attorney, Agent, or Firm* — Slater Matsil, LLP

(57) ABSTRACT

A magnetic material is constituted of a ferromagnetic or ferrimagnetic insulator in a double perovskite structure of $Sr_{3-x}A_xOs_{1-y}B_yO_6$ (0.5≤x≤0.5, −0.5≤y≤0.5). A is an alkali metal or alkaline earth metal atom, and B is a transition metal atom, alkali metal atom, or alkaline earth metal atom). The insulator may be $Sr_3OsO_6$, where x=y=0 in the above formula. $Sr_3OsO_6$ is formed to have a cubic crystal structure where strontium atoms, osmium atoms, and oxygen atoms are arranged at lattice points.

12 Claims, 7 Drawing Sheets

(51) Int. Cl.
- *H01L 43/10* (2006.01)
- *H01F 1/40* (2006.01)
- *B82Y 25/00* (2011.01)
- *H01F 10/193* (2006.01)
- *C23C 14/08* (2006.01)
- *C23C 14/28* (2006.01)
- *H01F 41/20* (2006.01)

(52) U.S. Cl.
CPC .......... *B82Y 25/00* (2013.01); *C01P 2002/30* (2013.01); *C01P 2002/34* (2013.01); *C23C 14/08* (2013.01); *C23C 14/28* (2013.01); *H01F 10/1933* (2013.01); *H01F 41/205* (2013.01)

(56) References Cited

U.S. PATENT DOCUMENTS

| | | | | |
|---|---|---|---|---|
| 5,567,330 A | * | 10/1996 | Dorothy | H01L 23/49888 216/18 |
| 6,686,319 B1 | * | 2/2004 | Tallon | B01J 35/0033 505/121 |
| 6,855,670 B1 | * | 2/2005 | Gopalakrishnan | C01G 29/006 505/121 |
| 2011/0113996 A1 | * | 5/2011 | Mariman | A01C 5/066 111/149 |

OTHER PUBLICATIONS

NTT Communication dated Feb. 12, 2019 (Year: 2019).*
Macquart et al., Inorg. Chem., 2005, 44(26), 9676-9683. (Year: 2005).*
Sleight et al., Inorg. Chem., 1962, 1(2), 245-250. (Year: 1962).*
Das et al., cond. mat., matrl. sci., 2011, 1-5. (Year: 2011).*
Samanta et al., Sci. Rep., 5:15010, 2015, 1-8. (Year: 2015).*
Yamaura et al., Phr. Rev. B, 63, 2001, 064401-1 to 064401-5. (Year: 2001).*
P. D. Baba et al. "Fabrication and Properties of Microwave Lithium Ferrites," IEEE Transactions on Magnetics, vol. 8, No. 1, 1972, pp. 83-94.
Sugahara et al. "A spin metal-oxide-semiconductor field-effect transistor using half-metallic-ferromagnet contacts for the source and drain," Applied Physics Letters, vol. 84, No. 13, 2004, pp. 2307-2309.

* cited by examiner

MAGNETIC MATERIAL AND MAGNETIC ELEMENT

CROSS-REFERENCE TO RELATED APPLICATIONS

This application claims priority to National phase entry PCT/JP2019/005561, filed on Feb. 15, 2019, which claims priority to Japanese Patent Application No. 2018-025897, filed on Feb. 16, 2018, which applications are hereby incorporated herein by reference.

TECHNICAL FIELD

The present invention relates to a ferromagnetic or ferrimagnetic material, and a magnetic device using the same.

BACKGROUND

Ferromagnetic or ferrimagnetic materials that are insulators (which will be hereinafter referred to as ferromagnetic insulators) have the characteristic of a large specific electrical resistance compared with ferromagnetic metals, and are widely applied to permanent magnets, core materials, isolators and circulators, and so on. Typical properties (material properties) of the foregoing ferromagnetic insulators include Curie temperature ($T_C$), initial permeability, relative loss factors, saturation magnetic flux density, and coercivity. Particularly, $T_C$ is a temperature above which ferromagnetism (or ferrimagnetism) is lost to lead to paramagnetism. As $T_C$ is higher, thermal stability is higher, which brings stable operation characteristics even at high temperatures.

Ferromagnetic insulators having a perovskite or double perovskite structure have the consistency with $SrTiO_3$ (perovskite structure), which is a typical oxide electronics material, and thus are promising for the application to spin electronics using oxides [such as a magnetoresistive random access memory (MRAM) and spin MOSFET] (NPL 1).

Table 1 shows $T_C$, saturation magnetization, and crystal forms of typical exiting ferromagnetic insulators (NPL 2). The highest $T_C$ is conventionally 943 K of $LiFe_5O_8$ having a spinel structure. As a ferromagnetic insulator having a double perovskite structure, $Sr_2CrOsO_6$ takes the maximum value of $T_C$ equal to 725 K.

TABLE 1

| material | $T_c$ (K) | saturation magnetization (emu/cc) | crystal form |
|---|---|---|---|
| $MuFe_2O_4$ | 573 | 520 | spinel |
| $NiFe_2O_4$ | 863 | 340 | spinel |
| $CoFe_2O_4$ | 500 | 793 | spinel |
| $CuFe_2O_4$ | 728 | 170 | spinel |
| $MgFe_2O_4$ | 713 | 140 | spinel |
| $LiFe_5O_8$ | 943 | 390 | spinel |
| $\gamma$-$Fe_2O_3$ | 848 | 520 | spinel |
| $BaFe_{12}O_{19}$ | 723 | 480 | magnetoplumbite |
| $SrFe_{12}O_{19}$ | 726 | 480 | magnetoplumbite |
| $Y_3Fe_5O_{12}$ | 560 | 170 | garnet |
| $Ca_2FeReO_6$ | 520 | | double perovskite |
| $Sr_2CrOsO_6$ | 725 | | double perovskite |

CITATION LIST

Non Patent Literature

[NPL 1] S. Sugahara, and M. Tanaka, "A spin metal-oxide-semiconductor field-effect transistor using half-metallic-ferromagnet contacts for the source and drain", Applied Physics Letters, vol. 84, no. 13, pp. 2307-2309, 2004.

[NPL 2] P. D. BABA, et al., "Fabrication and Properties of Microwave Lithium Ferrites", IEEE Transactions on Magnetics, vol. MAG-8, no. 1, pp. 83-94, 1972.

SUMMARY

Technical Problem

The Curie temperatures of the foregoing conventional ferromagnetic insulators are however lower than a value required in order for spintronics devices to have high thermal stability, which is problematic.

Embodiments of the present invention was made to solve the foregoing problem, and an object thereof is to make it possible to realize a magnetic material having a higher Curie temperature.

Means for Solving the Problem

A magnetic material according to embodiments of the present invention is constituted of a ferromagnetic or ferrimagnetic insulator in a double perovskite structure of $Sr_{3-x}A_xOs_{1-y}B_yO_6$ (−0.5≤x≤0.5, −0.5≤y≤0.5, A: an alkali metal or alkaline earth metal atom, B: a transition metal atom, alkali metal atom, or alkaline earth metal atom), wherein an atomic percentage of Sr is 25 to 35 at %.

In the magnetic material, the insulator is constituted of $Sr_3OsO_6$.

In the magnetic material, the insulator has a cubic crystal structure.

A magnetic device according to the present invention includes: a magnetic layer made from the foregoing ferromagnetic material; a first electrode; and a second electrode, the first and second electrodes being formed across the magnetic layer.

Effects of Embodiments of the Invention

As described above, according to embodiments of the present invention, an insulator made from $Sr_{3-x}A_xOs_{1-y}B_yO_6$ is used, which brings a fine effect, that is, a magnetic material having a higher Curie temperature can be realized.

DETAILED DESCRIPTION OF ILLUSTRATIVE EMBODIMENTS

Hereinafter a magnetic material in the embodiments of the present invention will be described. This magnetic material is m is constituted of a ferromagnetic or ferrimagnetic insulator in a double perovskite structure of $Sr_{3-x}A_xOs_{1-y}B_yO_6$ (−0.5≤x≤0.5, −0.5≤y≤0.5, A: an alkali metal or alkaline earth metal atom, B: a transition metal atom, alkali metal atom, or alkaline earth metal atom). In this magnetic material, the atomic percentage of Sr is 25 to 35 at %. Here, the foregoing insulator may be $Sr_3OsO_6$, which is $Sr_{3-x}A_xOs_{1-y}B_yO_6$ where x=y=0.

Figure 1:
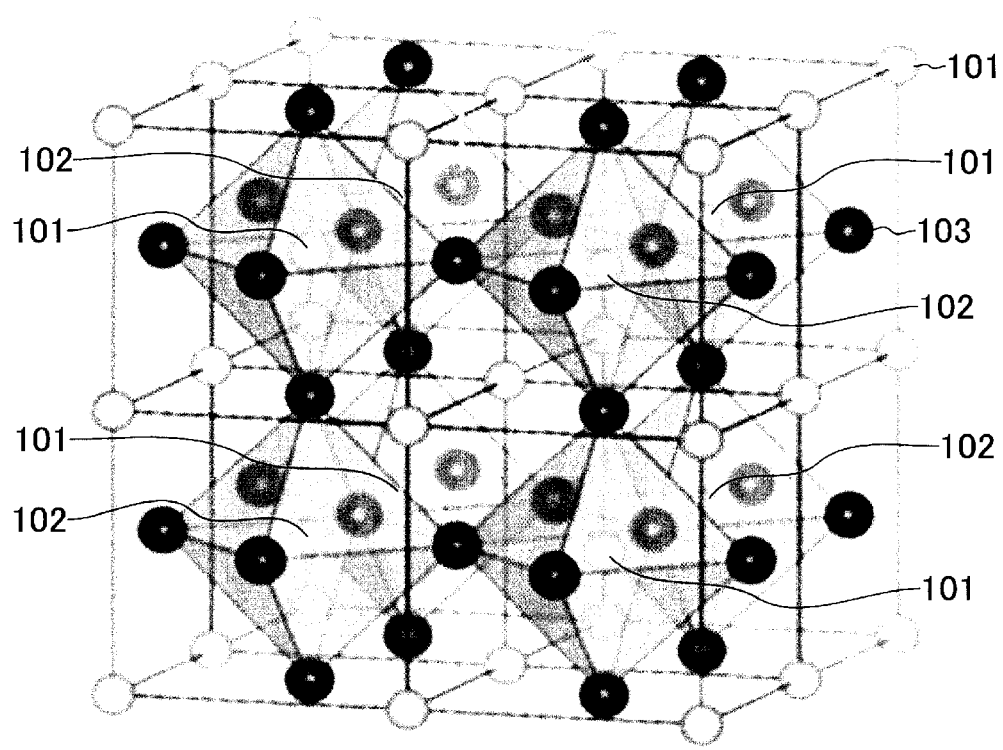
FIG. 1 is a perspective view of a crystal structure of $Sr_3OsO_6$ used as a magnetic material in the embodiments of the present invention.

In $Sr_3OsO_6$ constituting the magnetic material in the embodiments, strontium atoms 101, osmium atoms 102 and oxygen atoms 103 form a cubic crystal structure where lattice points are arranged as shown in FIG. 1. A magnetic material constituted of $Sr_3OsO_6$, which has the simplest composition, can be made only from three constituent elements (Sr, Os and O), and thus has the advantage of easy control of the composition thereof compared with the conventional ferromagnetic insulators having a double perovskite structure, each of which is constituted of four elements, shown in Table 1. The Curie temperature $T_C$ of the magnetic material in the embodiments which is constituted of $Sr_3OsO_6$ equals 1060 K. The foregoing crystal structure is not limited to the cubic crystal system, but may have a rhombic crystalline shape (the orthorhombic crystal system) or the tetragonal crystal system.

Hereinafter more detailed description will be made using the result of an experiment.

Figure 2:
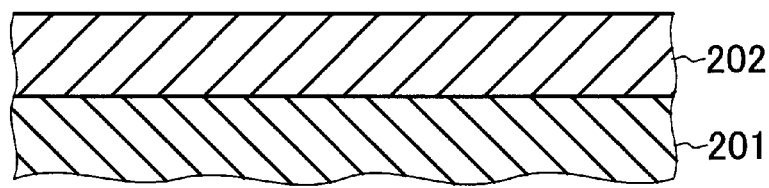
FIG. 2 is a cross-sectional view showing a situation where a magnetic material layer 202 that is made from $Sr_3OsO_6$ is made on a growth substrate 201 that is made from $SrTiO_3$ (001).

First, in the experiment, a magnetic material by $Sr_3OsO_6$ was made. As shown in FIG. 2, $Sr_3OsO_6$ was grown by well-known molecular beam epitaxy on a growth substrate 201 for growth which was made from $SrTiO_3(001)$, to form a magnetic material layer 202. A material such as MgO(001) and $(La_{0.3}Sr_{0.7})(Al_{0.65}Ta_{0.35})O_3(001)$ may be used for the growth substrate.

When the magnetic material layer 202 was formed by molecular beam epitaxy, the atomic beams of alkaline earth metal Sr and 5d transition metal Os were supplied in an ultra-high vacuum processing tank in the atmosphere of reactive oxygen species of approximately $10^{-6}$ Torr on the condition that the substrate temperature was 650° C. so that a predetermined composition ratio is obtained, to grow $Sr_3OsO_6$. The magnetic material layer 202 was formed to have a layer thickness of 300 nm.

The result (microscopy image) of observation of the made magnetic material layer 202 by means of a high-angle annular dark-field scanning transmission electron microscope (HAADF-STEM) will be described using FIG. 3. FIG. 3(a) is an image obtained by means of an incident electron beam in the [100] direction to the magnetic material layer 202. FIG. 3(b) is an image obtained by means of an incident electron beam in the [110] direction to the magnetic material layer 202.

Figure 3:
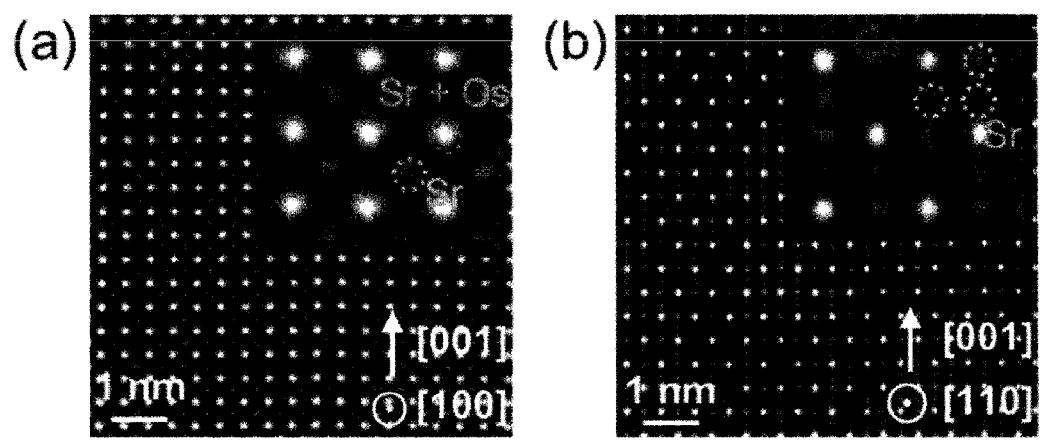
FIG. 3 shows micrographs of high-angle annular dark-field scanning transmission electron microscope images of the magnetic material layer 202.

It is found that as shown in FIG. 3, Sr and Os atoms are arranged in a highly ordered manner in the magnetic material layer 202, to form a single crystal having a cubic double perovskite structure. The arrangement of oxygen atoms was confirmed by an annular bright-field scanning transmission electron microscopy (ABF-STEM) image. The fact that the made magnetic material layer 202 had a cubic double perovskite structure was also confirmed by reflection high energy electron diffraction (RHEED) measurement in vacuum molecular beam epitaxy equipment, and θ-2θ measurement of X-ray diffraction (XRD) in the air outside molecular beam epitaxy equipment.

Figure 4:
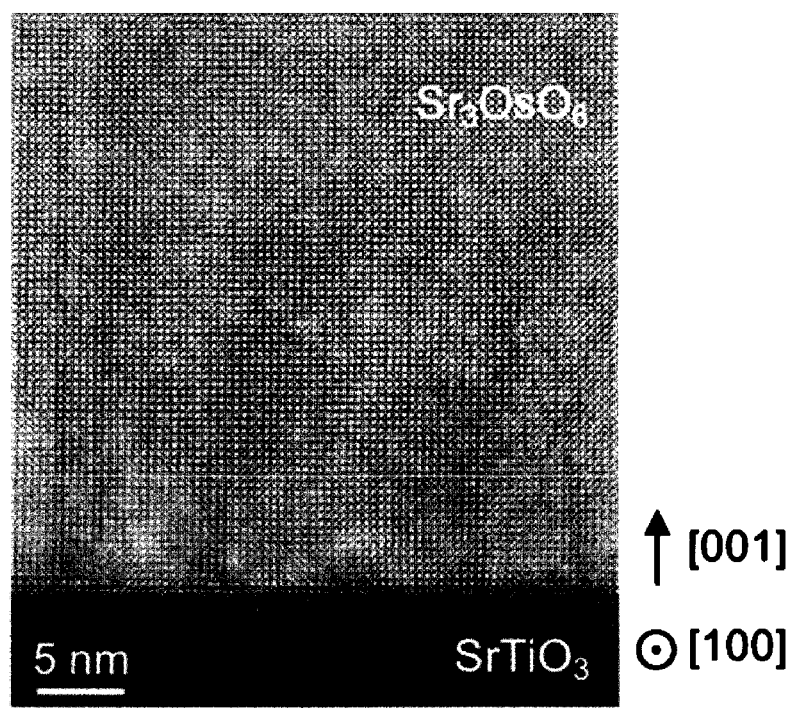
FIG. 4 shows a micrograph of a transmission electron microscopy image at the interface between the growth substrate 201 and the magnetic material layer 202.

FIG. 4 shows a transmission electron microscopy image at the interface between the growth substrate 201 and the magnetic material layer 202. It is found that single crystal growth of the magnetic material layer 202 from the growth substrate 201 epitaxially progresses. The relationships of the crystal orientation between the magnetic material layer 202 and the growth substrate 201 were such as $Sr_3OsO_6[001]//SrTiO_3[001]$ and $Sr_3OsO_6[100]//SrTiO_3[100]$.

Figure 5:
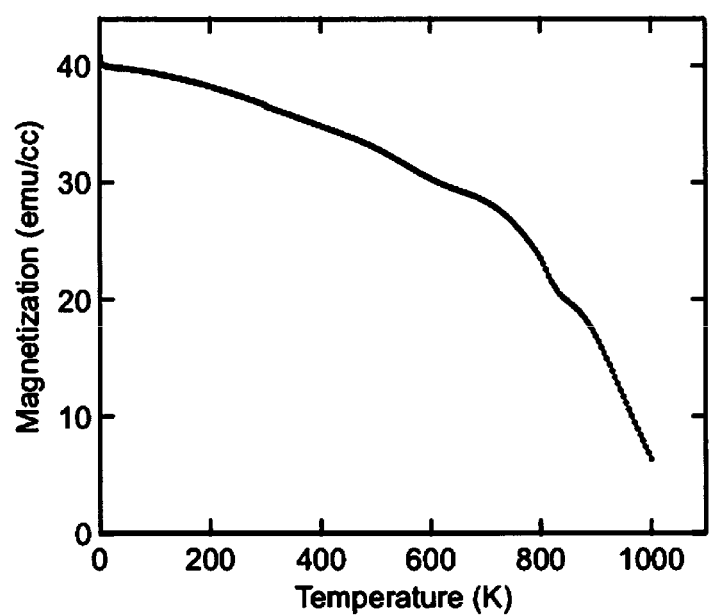
FIG. 5 is a characteristic diagram showing temperature dependence of magnetization of the magnetic material layer 202 in a magnetic field at 2000 Oe.

FIG. 5 shows temperature dependence of magnetization of the magnetic material layer 202 in a magnetic field at 2000 Oe. There still remains a magnetization of at least 5 emu/cc at 1000 K, and the magnetic material layer 202 has $T_C$ of at least 1000 K. The saturation magnetization of the magnetic material layer 202 at 1.9 K in a magnetic field at 70000 Oe was 49 emu/cc, which is a small value compared with the typical ferromagnetic insulators (or ferrimagnetic insulators) shown in Table 1. The coercivity of the magnetic material layer 202 at 1.9 K was 100 Oe. The spontaneous magnetization of the magnetic material layer 202 was lost at 700 K. $T_C$ as high as at least 1000 K is obtained if the difference in the atomic percentage of the composition of each element of the magnetic material layer 202 is within ±5%.

Figure 6:
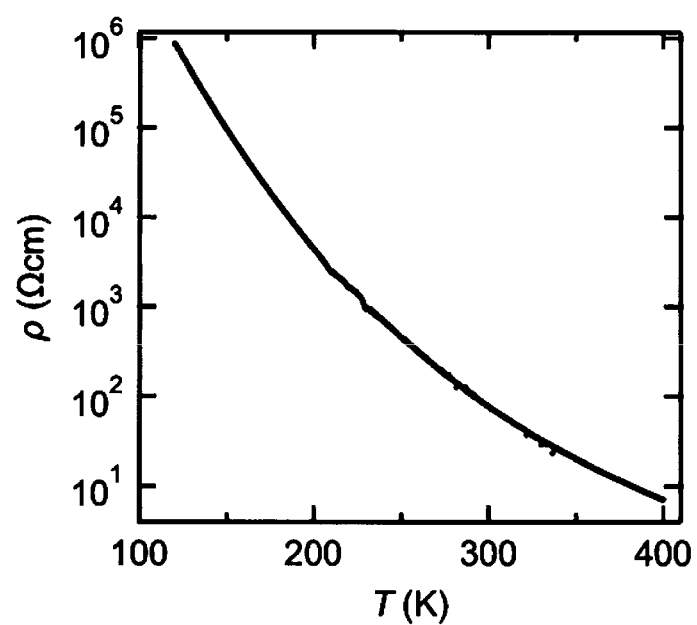
FIG. 6 is a characteristic diagram showing temperature dependence of specific electrical resistance ($\rho$) of the magnetic material layer 202.

FIG. 6 shows temperature dependence of specific electrical resistance (ρ) of the magnetic material layer 202. The specific electrical resistance is 75 Ωcm at 300 K, which is approximately room temperature: the magnetic material layer 202 has a typical electrical characteristic of insulators, that is, the specific electrical resistance is exponentially increasing as the temperature is dropping. As can be seen from this result, the magnetic material layer 202 is an insulator having a high specific electrical resistance of at least 10 Ωcm at room temperature. The relationship between specific electrical resistance and temperature (T) is such that ln (ρ) is proportional to $T^{-1/4}$, and thus the electrical conduction is caused by variable-range-hopping.

$Sr_3OsO_6$ has been described as an example in the above description. Such high $T_C$ as at least 1000 K is also obtained from $Sr_{3-x}A_xOsO_6$, which is $Sr_3OsO_6$ where (an) alkali or alkaline earth atom(s) (A) is/are partially substituted for Sr, as far as −0.5<X<0.5. Such high $T_C$ as at least 1000 K is also obtained from $Sr_{3-x}A_xOs_{1-y}B_yO_6$, which is $Sr_{3-x}A_xOsO_6$ where (a) transition metal atom(s) (B) is/are partially substituted for Os, as far as −0.5<Y<0.5. As described above, it is believed that a magnetic material constituted of an insulator having a double perovskite structure which is made from $Sr_{3-x}A_xOs_{1-y}B_yO_6$ (−0.5≤x≤0.5, −0.5≤y≤0.5, A: alkali metal or alkaline earth metal atom, B: transition metal atom, alkali metal atom, or alkaline earth metal atom) achieves such high $T_C$ as at least moo K as described above.

Characteristics of $Sr_3OsO_6$ do not depend on the way of growth. For example, even if the layer of the magnetic material is formed using sputtering or pulsed laser ablation, the same results are obtained.

There has been no report of such a ferromagnetic insulator having $T_C$ of at least moo K. Such a ferromagnetic insulator was synthesized first this time. Embodiments of the present invention makes it possible to apply a ferromagnetic insulator with good thermal stability to devices.

Figure 7:
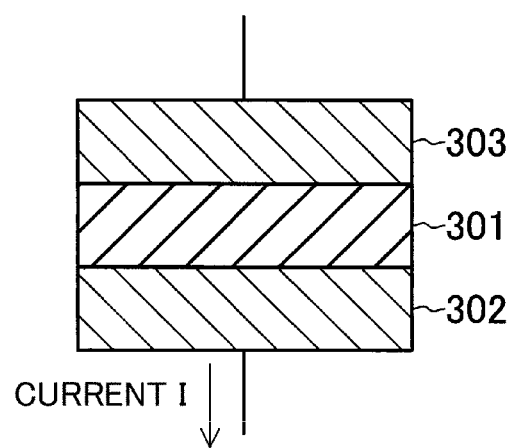
FIG. 7 is a cross-sectional view showing structure of a magnetic device in the embodiments of the present invention.

Next, a magnetic device in the embodiments of the present invention will be described with reference to FIG. 7. This magnetic device includes a magnetic layer 301 that is made from the foregoing ferromagnetic material, and a first electrode 302 and a second electrode 303 that are formed across the magnetic layer 301 from each other. This magnetic device is, for example, a tunneling magnetoresistive (TMR) device. The first electrode 302 is, for example, a conductive oxide substrate such as Nb:SrTiO$_3$. The second electrode 303 has only to be constituted of, for example, a ferromagnetic metal such as Fe and Co. The second electrode 303 has only to be made by a deposition process such as sputter deposition and electron beam evaporation. The second electrode 303 has only to be formed to have a thickness of approximately 20 to 30 nm. The tunneling magnetoresistance ratio when a voltage of 5 mV is applied to the made magnetic device is at least 500% at room temperature (300 K). The magnetic device, which uses the magnetic material layer 202, shows a very high tunneling magnetoresistance ratio.

As described above, embodiments of the present invention can realize a magnetic material having a higher Curie temperature since the magnetic material is constituted of $Sr_{3-x}A_xOs_{1-y}B_yO_6$ (−0.5≤x≤0.5, −0.5≤y≤0.5, A: alkali metal or alkaline earth metal atom, B: transition metal atom, alkali metal atom, or alkaline earth metal atom).

The magnetic material of the present invention, which has extremely high $T_C$ (taking the maximum value among all types of oxides and insulators) has good thermal stability, and can stand up to operation at high temperatures. Using this magnetic material makes it possible to make a magnetic device with good thermal stability which can stand up to operation at high temperatures.

The magnetic material constituted of $Sr_3OsO_6$ has a low saturation magnetization of 49 emu/cc, which leads to a low leakage magnetic field from the magnetic material, to reduce magnetic interference with magnetic devices when the devices using this magnetic material are highly integrated. A low saturation magnetization enables spin transfer switching with low power consumption.

The magnetic material of the present invention makes it easy to, for example, epitaxially grow single crystals on an oxide substrate, and is a material having the consistency with other electronic devices using oxides to a high degree. For example, TMR devices using a magnetic layer of a magnetic material made from $Sr_3OsO_6$ achieve a high magnetoresistance ratio of at least 500% at room temperature, and are very promising as spin electronics devices because having each of the foregoing characteristics thereof.

It is obvious that the present invention is not limited to the above described embodiments, but various modifications and combinations may be made by a person skilled in the art within the technical concept of the present invention.

REFERENCE SIGNS LIST

101 Strontium atom
102 Osmium atom
103 Oxygen atom
201 Growth substrate
202 Magnetic material layer
301 Magnetic layer
302 First electrode
303 Second electrode

The invention claimed is:

1. A magnetic material which is constituted of:
   a ferromagnetic or ferrimagnetic insulator in a double perovskite structure of $Sr_{3-x}A_xOs_{1-y}B_yO_6$;
   wherein 0≤x≤0.5;
   wherein 0≤y≤0.5;
   wherein A is an alkali metal or alkaline earth metal;
   wherein B is a transition metal, an alkali metal atom, or analkaline earth metal atom; and
   wherein an atomic percentage of Sr is in a range of 25 at % to 35 at %.

2. The magnetic material according to claim 1, wherein the ferromagnetic or ferrimagnetic insulator is constituted of $Sr_3OsO_6$.

3. The magnetic material according to claim 1, wherein:
   the ferromagnetic or ferrimagnetic insulator has a cubic crystal structure.

4. The magnetic material of claim 3, wherein a strontium atom is a lattice point of the cubic crystal structure.

5. The magnetic material of claim 3, wherein an osmium atom is a lattice point of the cubic crystal structure.

6. The magnetic material of claim 3, wherein an oxygen atom is a lattice point of the cubic crystal structure.

7. A magnetic device comprising:
   a magnetic layer made from a ferromagnetic insulator in a double perovskite structure of $Sr_{3-x}A_xOs_{1-y}B_yO_6$, wherein 0≤x≤0.5, wherein 0≤x≤0.5, wherein A is an alkali metal or alkaline earth metal, wherein B is a transition metal, an alkali metal atom, or analkaline earth metal atom, and wherein an atomic percentage of Sr is in a range of 25 at % to 35 at %;
   a first electrode; and
   a second electrode, the magnetic layer is between the first electrode and the second electrode.

8. The magnetic device according to claim 7, wherein the ferromagnetic insulator is constituted of $Sr_3OsO_6$.

9. The magnetic device according to claim 7, wherein:
   the ferromagnetic insulator has a cubic crystal structure.

10. The magnetic device according to claim 9, wherein a strontium atom is a lattice point of the cubic crystal structure.

11. The magnetic device according to claim 9, wherein an osmium atom is a lattice point of the cubic crystal structure.

12. The magnetic device according to claim 9, wherein an oxygen atom is a lattice point of the cubic crystal structure.

* * * * *